310-337
5/29/79
SR
XR 4,156,824

United States Patent [19]

Pence, Jr.

[11] 4,156,824

[45] May 29, 1979

[54] COMPOSITE LOW FREQUENCY TRANSDUCER

[75] Inventor: Elbert A. Pence, Jr., Seattle, Wash.

[73] Assignee: The United States of America as represented by the Secretary of the Navy, Washington, D.C.

[21] Appl. No.: 860,670

[22] Filed: Dec. 15, 1977

[51] Int. Cl.² .......... H01L 41/10

[52] U.S. Cl. .......... 310/321; 310/337; 310/312

[58] Field of Search .......... 310/321, 322, 323, 334, 310/337, 369; 340/8 R, 10

[56] References Cited

U.S. PATENT DOCUMENTS

| | | | |
|---|---|---|---|
| 2,812,452 | 11/1957 | Harris | 310/337 X |
| 3,111,595 | 11/1963 | Junger | 310/321 X |
| 3,281,726 | 10/1966 | Schafft | 310/321 X |
| 3,560,771 | 2/1971 | Baker, Jr. | 310/322 |
| 3,718,897 | 2/1973 | Abbott | 310/337 X |

*Primary Examiner*—Mark O. Budd
*Attorney, Agent, or Firm*—R. S. Sciascia; Charles D. B. Curry

[57] ABSTRACT

A composite low frequency transducer that makes it possible to lower the natural frequency and use higher power levels than can be obtained with a ceramic transducer alone. The transducer includes metal and ceramic elements. The metal element consists of a cylindrical shell which is multiply slitted longitudinally and alternately from each end, the alternate slits extending substantially but not completely to the opposite end. The ceramic transducer element is cylindrical and is in contact with and centrally positioned within the slitted exterior shell. The resulting composite transducer operates at a frequency which is several octaves less than the natural lowest frequency of the ceramic transducer alone.

14 Claims, 15 Drawing Figures

COMPOSITE LOW FREQUENCY TRANSDUCER

BACKGROUND OF THE INVENTION

Field of the Invention

The present invention relates to a transducer and more particularly to a composite low frequency transducer.

Description of the Prior Art

In the field of low frequency communication the size, weight and power consumption of transducers is very important. This is particularly the case in low frequency underwater communication where it is necessary to go to lower and lower frequencies of communication. Low frequency ceramic or piezoelectric type transducers are widely used for these low frequency acoustic communication purposes. However, a major problem is encountered by going to lower frequencies since there is an inverse ratio between low frequency and transducer size. This means that the ceramic transducer will not only be physically larger but it will consume more ceramic material, it will be heavier, it will cost more, it may consume more power and it is more difficult to manufacture. For example, a typical ceramic transducer for operation at 15.8 KHz will have an outside diameter of 3 inches. To operate at 6 KHz it is necessary to increase the diameter to 9 inches. This increase in physical size can be prohibitive for many applications.

The present invention overcomes these problems by providing a composite low frequency transducer that has a substantially lower natural frequency than a ceramic transducer of the same size. In accordance with the present invention it is possible to operate at 6 KHz with a composite transducer having a diameter only slightly larger than the 3 inch diameter of the ceramic transducer that is used as part of the composite transducer.

SUMMARY OF THE INVENTION

Briefly, the present invention comprises a composite low frequency transducer that makes it possible to lower the natural frequency and use higher power level than can be obtained with a ceramic transducer alone. The metal element consists of a cylindrical shell which is multiply slitted longitudinally and alternately from each end, the alternate slits extending substantially but not completely to the opposite end. The ceramic transducer element is cylindrical and is in contact with and centrally positioned within the slitted exterior shell. The resulting composite transducer operates at a frequency which is several octaves less than the natural lowest frequency of the ceramic transducer alone.

STATEMENT OF THE OBJECTS OF THE INVENTION

An object of the present invention is to provide a relatively small, reliable and effective low frequency transducer;

Another object of the present invention is to provide a composite transducer that uses a ceramic transducer and operates at a lower natural frequency than that of the ceramic transducer alone;

Still another object of the present invention is to provide a composite transducer that uses a ceramic transducer wherein the composite transducer is smaller, lighter and consumes less power than a ceramic transducer alone that operates at the same frequency;

A further object of the present invention is to provide a low frequency composite transducer that employs a ceramic transducer and a surrounding slotted metal shell;

Other objects, advantages and novel features of the invention will become apparent from the following detailed description of the invention when considered in conjunction with the accompanying drawings wherein:

DESCRIPTION OF THE PREFERRED EMBODIMENT

Figures 1A, 1B, 1C, 1D, 2A, 2B, 3A, 3B:
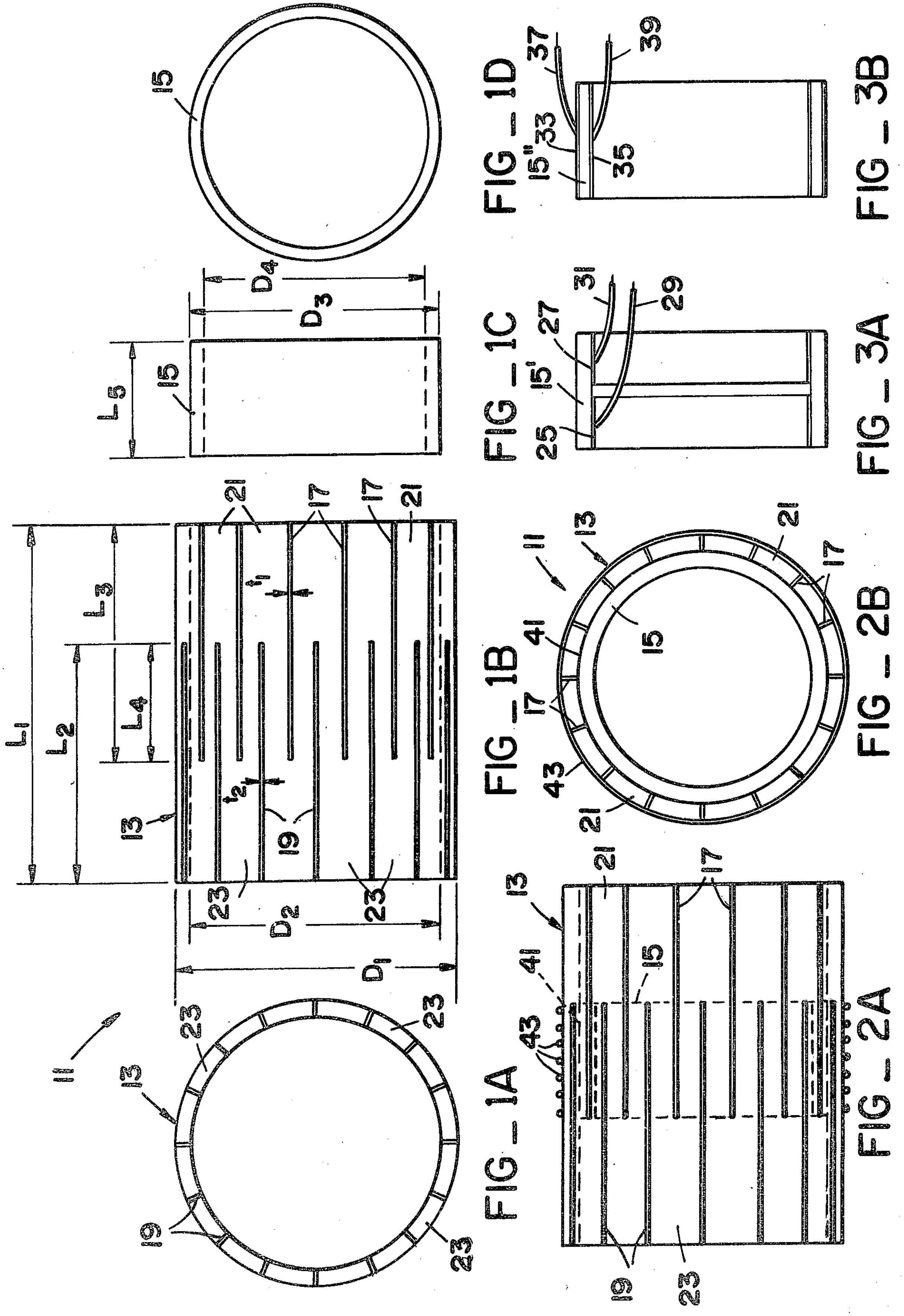
FIGS. 1A, 1B, 1C and 1D are an exploded view of the composite low frequency transducer of the present invention.
FIGS. 2A and 2B are respectively side and end assembly views of one embodiment of the composite low frequency transducer of the present invention.
FIGS. 3A and 3B are two ceramic transducers having different electrode positions.

In FIGS. 1A, 1B, 1C and 1D are illustrated the exploded view and in FIGS. 2A and 2B are illustrated the assembled view of one embodiment of the composite low frequency transducer 11 of the present invention. The two principal components of the composite transducer 11 are cylindrical shell 13, shown in FIGS. 1A and 1B and ceramic transducer 15, shown in FIGS. 1C and 1D. When assembled ceramic transducer 15 is positioned centrally within cylindrical shell 13 as shown in FIGS. 2A and 2B.

Referring to FIGS. 1A, 1B, 2A and 2B, cylindrical shell 13 includes a plurality of longitudinally extending slots 17 that extend through the thickness and longitudinally from the right end about two thirds the length of the cylindrical shell 13. Cylindrical shell 13 also includes a plurality of longitudinally extending slots 19 that extend through the thickness and longitudinally from the left end about two thirds the length of the cylindrical shell 13. As illustrated in the drawings there are 16 slots 17 and 16 slots 19 and slots 17 are offset with respect to slots 19 so that they interlace and are about equispaced from each other in the middle section of the shell 13 as best depicted in FIG. 1B. It should be particularly noted that cylindrical shell 13, when slotted in this manner, becomes very flexible and forms a plurality of flexible leaves 21 on the right third of shell 13 and a plurality of flexible leaves 23 on the left third of shell 13. Shell 13 is preferably made of aluminum. However, it has been found that it may be made of other materials such as brass, tungsten, or the like.

Referring to FIGS. 1C, 1D, 2A and 2B ceramic transducer 15 is of the conventional type and comprises an elongated cylinder made of piezoelectric material and has two lead wires connected to the respective electrodes. For clarity of illustration the lead wires and electrodes are not shown in FIGS. 1 and 2. However, in FIG. 3A is illustrated one type of ceramic transducer 15' having two interior spaced apart electrodes 25 and 27 and lead wires 29 and 31 respectively connected thereto. In FIG. 3B is illustrated another type of ceramic transducer 15'' having an exterior electrode 33 and an interior electrode 35 and lead wires 37 and 39 respectively connected thereto. These are conventional types of ceramic transducers and both operate, by radially expanding and contracting at their natural frequency, in the same manner.

Referring to the assembled composite transducer shown in FIGS. 2A and 2B it should be noted that the diameter $D_3$ (see FIG. 1C) of the ceramic transducer 15 is preferably made slightly larger than the inside diameter $D_2$ (see FIG. 1B) of the shell 13 and they are assembled by press fitting. In addition, it is preferable that the exterior surface of ceramic transducer 15 be adhered to the interior surface of shell 13 by epoxy glue or the like as illustrated by reference numeral 41 in FIGS. 2A and 2B. Furthermore, it is preferable that the central exterior region of shell 13 be wrapped by a wire 43 to hold that region in compression against ceramic transducer 15. The reasons for this will be hereinafter explained in the discussion describing the operation of the composite transducer 11.

The following table is a specification of the various elements of the composite low frequency transducer 11, as illustrated in FIGS. 1 and 2. It is to be understood that these examples are typical and that it will be obvious to one skilled in the art that they may be modified or changed providing these changes are compatible with the teachings of the present invention.

| |
|---|
| Cylindrical shell 13 |
| material - aluminum 6061 T6 |
| $D_1$ = 3.220 inch |
| $D_2$ = +0.003 −0.000 |
| $L_1$ = 4.20 inch |
| $L_2$ = 2.80 inch |
| $L_3$ = 2.80 inch |
| $L_4$ = 1.40 inch |
| $t_1$ = 1/32 inch |
| $t_2$ = 1/32 inch |
| Ceramic transducer 15 |
| material - piezoelectric |
| $D_3$ = 3.00 inch |
| $D_4$ = 2.70 inch |
| $L_5$ = 1.40 inch |
| power = 100 watt pulses having a pulse width of from 1 to 4 ms and having a repetition rate of 2 pulses/second. |
| natural frequency of ceramic transducer 15 alone = 15.8KHz |
| Composite transducer 11 |
| power = 100 watt pulses having a pulse width of from 1 to 4 ms and having a repetition rate of 2 pulses/second |
| natural frequency = 6.0 KHz |

When using a ceramic transducer 15″ of the type shown in FIG. 3B it is necessary to very carefully solder the lead wire to electrode 33 at a location that is within a slot and then bring the insulated lead wire 37 out through the slot. The other lead wire 39 is easily soldered to electrode 35 and taken out through the central region. If it is found difficult to make a proper solder connection to the outer electrode as above described it may be preferable to use a ceramic transducer of the type shown in FIG. 3A. In this transducer both lead wires are connected to interior electrodes which may be then easily taken out through the central region. It has been found that wire wrapping causing an inward compressive loading to shell 13 of from about 400 to about 1000 pounds per square inch, for example, is quite desirable. After the composite low frequency transducer 11 has been assembled it is then generally desirable to pot it with epoxy or polyurethane, or the like.

Figure 4A:
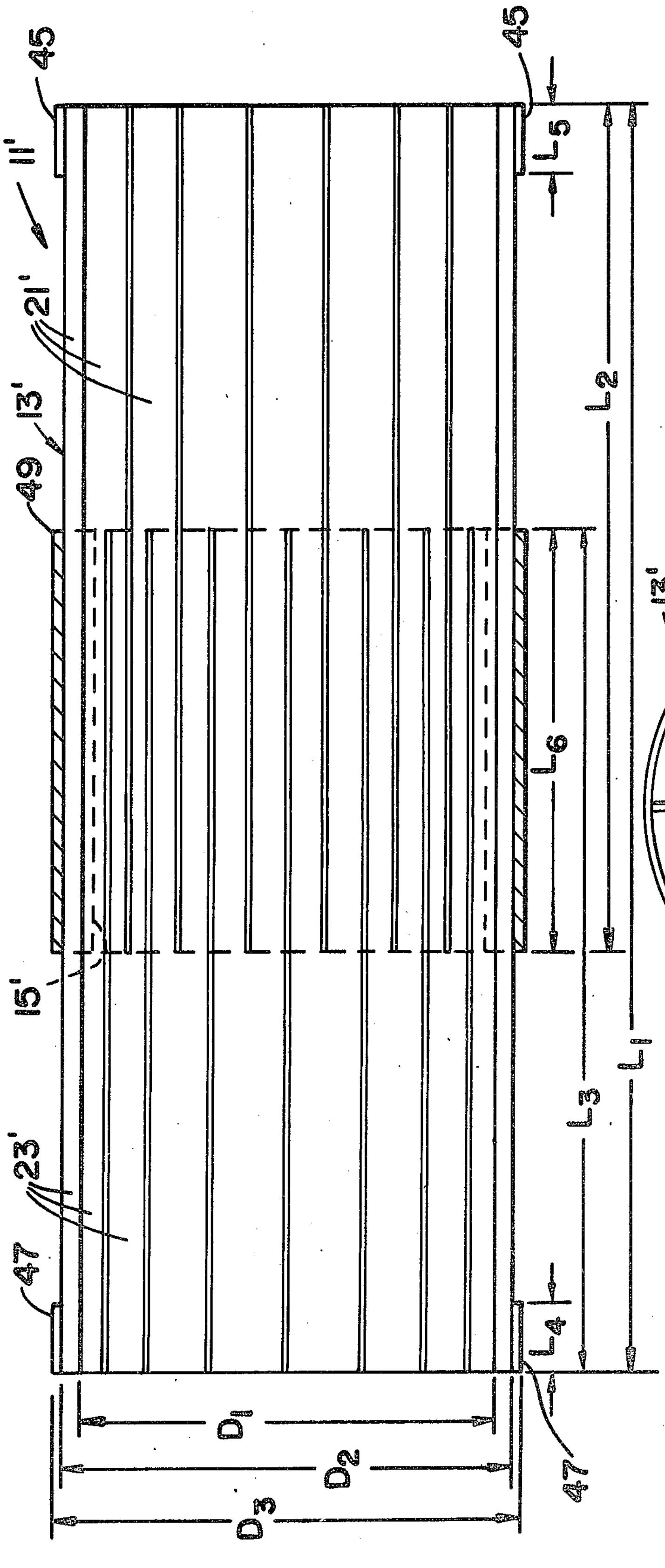
FIGS. 4A and 4B are respectively side and end assembly views of another embodiment of the composite low frequency transducer of the present invention.
Figure 4B:
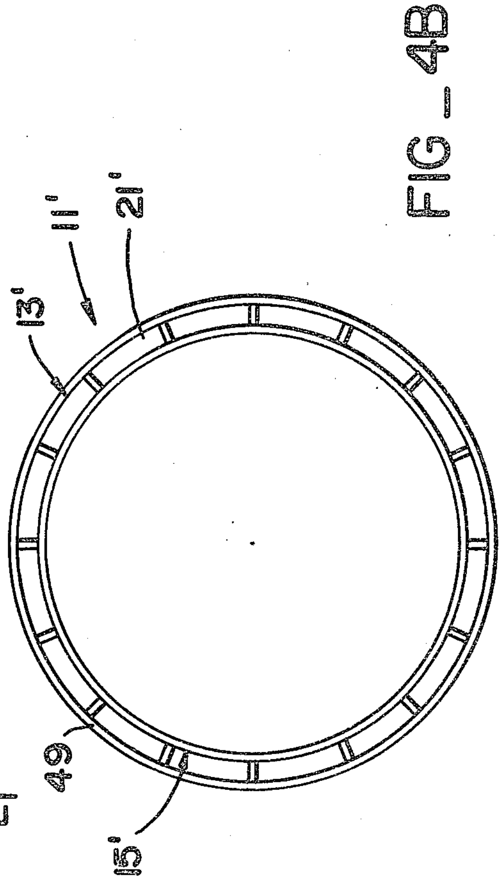

In FIGS. 4A and 4B is shown another embodiment of the present invention. The composite low frequency transducer 11′ of this embodiment includes cylindrical shell 13′ having longitudinally extending slots 17′ and 19′, flexible leaves 21′ and 23′ are ceramic transducer 15′ which are similar to those features of the previously described embodiment. In addition to these features the embodiment of FIGS. 4A and 4B includes enlarged end sections 45 and 47 that are respectively attached to leaves 21′ and 23′. These enlarged sections provide a greater end weight and a lower natural frequency and may be constructed by initially turning their enlarged configuration on a lathe and then forming the slots as illustrated. This embodiment also includes a layered wrap 49 that is preferably made of a fiber glass weaved cloth or the like. In order to apply a 1000 pound compressive load, for example, 100 loops of fiber glass cloth may be wound onto the cylindrical shell 13′ using a tension of 10 pounds and cemented in place by an epoxy as it is being wound.

Figures 5A, 5B, 5C, 5D, 5E:
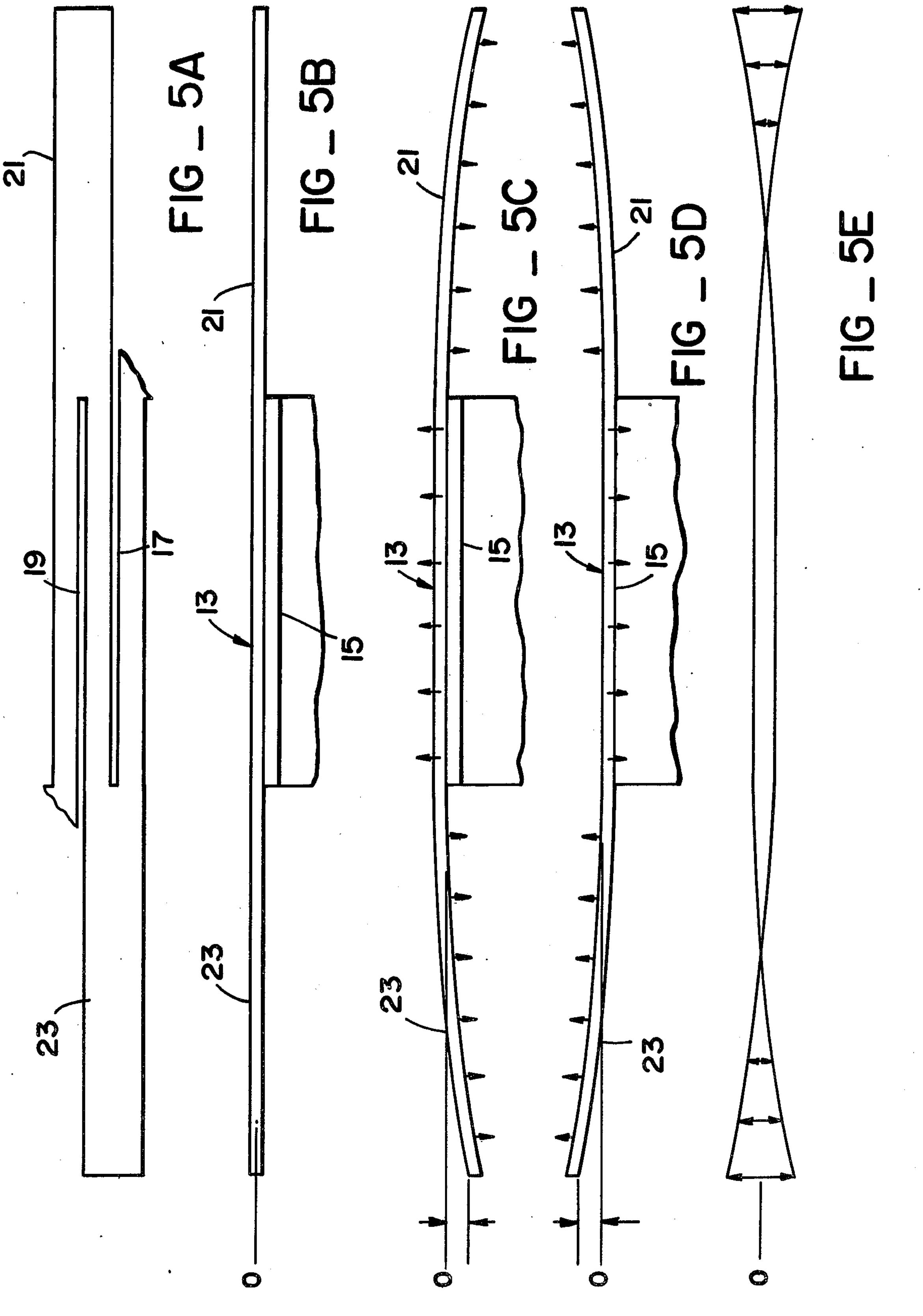
FIGS. 5A, 5B, 5C, 5D and 5E are schematic illustrations of the operation of the composite low frequency transducer of the present invention.

The illustrative dimensions used in this embodiment are as follows:

$L_1$=9.00 inch
$L_2$=6.00 inch
$L_3$=6.00 inch
$L_4$=0.75 inch
$L_5$=0.75 inch
$D_1$=3.96 inch
$D_2$=4.02 inch
$D_3$=4.30 inch In FIGS. 5A, 5B, 5C, 5D and 5E is illustrated the operation of the composite low frequency transducer 11 of the present invention. At the outset it should be noted that, based on the conservation of energy concept, a reduction in the natural frequency of the ceramic transducer 15 by a factor of three requires that an amplitude be increased by a factor of three if the same power is being applied (amplitude $=1/f_{natural}(k)$). This is closely approximated in the operation of the composite transducer 11 as shown in FIGS. 5A through 5E. That is, in FIGS. 5A and 5B are illustrated a pair of leaves 21 and 23 in their neutral state as shown by the zero reference line of FIG. 5B. In FIG. 5C the ceramic transducer 15 is shown as expanding which raises the central section of shell 13 by the same amount. At the same time the reactive loading causes leaves 21 and 23 to flex downward as illustrated. In FIG. 5D the reverse cycle is illustrated wherein ceramic transducer 15 is shown as contracting which lowers the central section of shell 13 by the same amount below the zero reference line. At the same time the reactive loading causes leaves 21 and 23 to flex upward as illustrated. This process will repeat and continue at the natural frequency of the composite transducer system as illustrated by the center line system representation of FIG. 5E. It is important to note that it is very important to preload the shell 13 and ceramic transducer 15 in compression. This is because it is necessary to hold shell 13 and ceramic transducer 15 in facial contact as an integral unit to achieve proper operation. This is achieved by using cement and compressive loading (using negative clearance) and compressive wrapping. This maintains the ceramic transducer in compression and prevents it from fracture (ceramic transducers are relatively weak in tension). This also makes it possible to use greater electric power for greater acoustic transmission. The primary functions of slotted cylindrical shell 13 is that it increases transducer system compliance (slots 19 give it a springy behavior) and it increases transducer system inertance (the mass of shell 13 provides an increase in system mass).

What is claimed is:

1. A composite low frequency transducer comprising:

(a) a cylindrical shell and a cylindrical ceramic transducer;

(b) said cylindrical shell including a plurality of slots, said slots and shell together forming first and second sets of leaves, said first set of leaves being on one end of said shell and said second set of leaves being on the other end of said shell; said shell including a central section between said first set of leaves and said second set of leaves;

(c) said ceramic transducer being positioned within said central section and in facial contact with the interior surface of said shell; whereby (d) the natural frequency of said cylindrical shell and said ceramic transducer being less than the natural frequency of said ceramic transducer alone.

2. The transducer of claim 1 wherein:

(a) said shell is made of aluminum.

3. The transducer of claim 1 wherein:

(a) each of said first set of leaves includes an enlarged end section and each of said second set of leaves includes an enlarged end section.

4. A composite low frequency transducer comprising:

(a) a cylindrical shell and a cylindrical ceramic transducer;

(b) said cylindrical shell being multiply slitted longitudinally through the thickness of said shell and alternately from each end; the alternate slits extending substantially but not completely to the opposite end;

(c) said ceramic transducer being centrally positioned within said cylindrical shell and in contact with the interior surface of the central region of said shell; whereby (d) the natural frequency of said cylindrical shell and said ceramic transducer being less than the natural frequency of said ceramic transducer alone.

5. The transducer of claim 4 wherein:

(a) said shell is made of metal.

6. A composite low frequency transducer comprising:

(a) a cylindrical shell and a cylindrical ceramic transducer;

(b) said cylindrical shell includes a plurality of first slots that extend through the thickness and longitudinally from one end of said shell to about one third the distance from the other end of said shell and a plurality of second slots that extend through the thickness and longitudinally from the other end of said shell to about one third the distance from the other end of said shell wherein said first and second slots are offset with respect to each other so that they interlace in a central section and are about equispaced from each other;

(c) said ceramic transducer being positioned within said central section and in facial contact with the interior surface of said shell; whereby (d) the natural frequency of said cylindrical shell and said ceramic transducer being less than the natural frequency of said ceramic transducer alone.

7. The transducer of claim 6 wherein:

(a) said shell is selected from the group of metals consisting of aluminum, brass and tungsten.

8. The transducer of claims 2 including means for maintaining said ceramic transducer in radial compression comprising a wire wrapped in tension around said central section and on the exterior surface of said shell.

9. The transducer of claims 2 including means for maintaining said ceramic transducer in radial compression comprising a fiber glass cloth wrapped in tension around said central section and on the exterior surface of said shell.

10. The transducer of claims 2, wherein the internal diameter of the central section of said shell is smaller in diameter than the outside diameter of said ceramic transducer in which it is in contact with such that the transducer is maintained in radial compression.

11. The transducer of claim 5, wherein the internal diameter of the central section of said shell is smaller in diameter than the outside diameter of said ceramic transducer in which it is in contact with such that the transducer is maintained in radial compression.

12. The tranducer of claim 7 including means for maintaining said ceramic transducer in radial compression comprising a wire wrapped in tension around said central section and on the exterior surface of said shell.

13. The transducer of claim 7 including means for maintaining said ceramic transducer in radial compression comprising of fiber glass cloth wrapped in tension around said central section and on the exterior surface of said shell.

14. The transducer of claim 7 wherein the internal diameter of the central section of said shell is smaller in diameter than the outside diameter of said ceramic transducer is maintained in radial comprission.

* * * * *